United States Patent
Koizumi

(10) Patent No.: US 8,437,019 B2
(45) Date of Patent: May 7, 2013

(54) IMAGE PROCESSING APPARATUS PROVIDED WITH AN IMAGE MEMORY USED BY A PLURALITY OF BOARDS PERFORMING EXPANDED DATA PROCESSINGS, BACKUP PROCESSING METHOD, AND STORAGE MEDIUM STORING PROGRAM READABLE BY COMPUTER

(75) Inventor: Shigeru Koizumi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/477,699

(22) Filed: May 22, 2012

(65) Prior Publication Data

US 2012/0229836 A1 Sep. 13, 2012

Related U.S. Application Data

(63) Continuation of application No. 11/372,625, filed on Mar. 10, 2006, now Pat. No. 8,203,727.

(30) Foreign Application Priority Data

Mar. 16, 2005 (JP) .................... 2005-074736

(51) Int. Cl.
*G06K 15/00* (2006.01)
*G11C 5/14* (2006.01)

(52) U.S. Cl.
USPC .................... 358/1.14; 358/1.16; 365/229

(58) Field of Classification Search .................. None
See application file for complete search history.

(56) References Cited

U.S. PATENT DOCUMENTS

| 5,282,054 | A | * | 1/1994 | Oana et al. | 358/406 |
| 5,668,642 | A | * | 9/1997 | Yoshida | 358/437 |
| 5,719,816 | A | * | 2/1998 | Ishikawa | 365/229 |
| 6,480,297 | B1 | * | 11/2002 | Suzuki et al. | 358/1.16 |
| 2002/0043959 | A1 | * | 4/2002 | Tanaka et al. | 320/116 |
| 2002/0051228 | A1 | * | 5/2002 | Spears et al. | 358/445 |
| 2004/0239997 | A1 | * | 12/2004 | Byun | 358/402 |
| 2005/0179935 | A1 | * | 8/2005 | Ogura et al. | 358/1.14 |

* cited by examiner

*Primary Examiner* — Ming Hon
(74) *Attorney, Agent, or Firm* — Canon USA Inc IP Division

(57) ABSTRACT

An image processing apparatus for eliminating the necessity of providing a first control board with a power supply unit beforehand for backing up data stored in an image memory, and reducing the cost of the apparatus as a whole. To accomplish this, in an image processing apparatus including a system control board configured to perform image processing, a memory backup function is enabled for an image memory storing data to be processed by the system control board, when a facsimile communication board is connected.

9 Claims, 5 Drawing Sheets

MEMORY MAP OF STORAGE MEDIUM

IMAGE PROCESSING APPARATUS PROVIDED WITH AN IMAGE MEMORY USED BY A PLURALITY OF BOARDS PERFORMING EXPANDED DATA PROCESSINGS, BACKUP PROCESSING METHOD, AND STORAGE MEDIUM STORING PROGRAM READABLE BY COMPUTER

The present application is a continuation of U.S. patent application Ser. No. 11/372,625, filed on Mar. 10, 2006, entitled "IMAGE PROCESSING APPARATUS PROVIDED WITH AN IMAGE MEMORY USED BY A PLURALITY OF BOARDS PERFORMING EXPANDED DATA PROCESSINGS, BACKUP PROCESSING METHOD, AND STORAGE MEDIUM STORING PROGRAM. READABLE BY COMPUTER", the content of which is expressly incorporated by reference herein in its entirety. This application also claims priority from Japanese Application No. 2005-074736 filed Mar. 16, 2005, which is hereby incorporated by reference herein in their entirety.

BACKGROUND OF THE INVENTION

1. Field of the Invention

The present invention relates to an image processing apparatus provided with an image memory used by a plurality of control boards performing expanded data processings, a backup processing method, a storage medium storing a program readable by a computer, and a program.

2. Description of the Related Art

Recently MFP (Multi-Function Peripheral) devices, which are equipped with a facsimile function, a printer function, a copier function, have been in demand. There are various kinds of MFP devices, including devices equipped with all available functions, or devices having select functions, but not necessarily all available functions. Many MFP devices which have a control board which is used for processing each function in order to enable a combination of the functions to be simultaneously performed depending on a demand of a user. In addition, an MFP generally requires image memory to perform various image processing and image editing functions (e.g., printing, copying, facsimile).

In most circumstances, when power fails in an MFP before printing facsimile reception image data, if image memory information is erased, it is difficult to revive the erased image data. Therefore, it is preferable for image memory storing the image data which received a facsimile to be backed up. On the other hand, in the printer function or copier function, it is comparatively easy to revive the image data.

In the above-mentioned MFP devices, there are devices in which a printer and copier function come as standard equipment in the device. Also the same device may be optionally equipped with a facsimile function. In such an MFP device, image memory, which is used with printer and copier function, is provided with the device. And if the same image memory is used with the facsimile function in common, an inexpensive MFP device can be provided. And since backing up image memory for image data used in printer and copier functions are not necessary, it is enough to only provide sufficient backup memory for facsimile reception image data. Therefore also, when the digital MFP apparatus does not have a facsimile communication function, there is no need for such a backup.

However, with many MFP apparatuses, an image memory is backed up regardless of whether or not the digital MFP apparatus has a facsimile communication function. For example, Japanese Patent Application Laid-Open No. 8-129511 (corresponding to U.S. Pat. No. 5,719,816) discloses a facsimile apparatus which is provided with an image memory composed of a DRAM etc., and which has a memory reception function. When the facsimile apparatus performs a predetermined memory backup process, the facsimile apparatus determines whether or not effective data is stored in the whole memory so as to avoid waste of a backup battery. While a main power stops, the backup battery is controlled to discharge so as to store information received by refresh processing of the memory.

Specifically, a DRAM (dynamic memory) is used as a storage memory, and the whole storage memory is held (backed up) unconditionally when the main power stops. Only when effective data is stored in the storage memory, the backup function is operated when the main power stops.

However, when the teachings from Japanese Patent Application Laid-Open No. 8-129511 are applied to a configuration in which a facsimile communication function can be provided as an optional feature, a backup process of a memory using a backup battery will be performed regardless of the presence or absence of the facsimile communication function. Therefore, an unnecessary battery for such a backup increases the cost of the apparatus as a whole, thus driving up the cost of the apparatus. Further, there is a drawback in that the backup battery is consumed unnecessarily.

Moreover, in the memory backup method according to Japanese Patent Application Laid-Open No. 8-129511, the backup function is operated according only to the presence or absence of effective data, regardless of the amount of data stored in the storage memory. Therefore, in a case where the storage memory is composed of a plurality of ICs or memory blocks, there is a drawback in that a consumption efficiency of the backup battery is not optimal since the backup function is operated even when the amount of effective data is small.

SUMMARY OF THE INVENTION

An aspect of the present invention is to overcome the above-described drawbacks. Another aspect of the present invention is to reduce the cost of an image processing apparatus as a whole, while performing a data backup function when an optional control board is connected. Still another aspect of the present invention is to improve the efficiency with respect to the use of backup power.

In one embodiment of the present invention, an image processing apparatus includes a first control unit adapted to perform image processing, a storage unit adapted to store image data, a second control unit adapted to expand a processing function of the first control unit, and a first power supply unit adapted to supply power for backing up the image data stored in the storage unit, wherein the first power supply unit is provided in the second control unit.

In another embodiment of the present invention, a backup processing method in an image processing apparatus including a first control unit adapted to perform image processing, includes supplying power for backing up image data stored in a storage unit from a first power supply unit on a second control unit adapted to expand a processing function of the first control unit.

In another embodiment of the present invention, a computer-readable storage medium storing a program is provided having computer-executable instructions for performing a backup processing method in an image processing apparatus which includes a first control unit adapted to perform image processing. The computer readable medium includes computer-executable instructions for supplying power for backing up image data stored in a storage unit from a first power supply unit on a second control unit adapted to expand a processing function of the first control unit.

In another embodiment of the present invention, a program is provided performing a backup processing method in an image processing apparatus which includes a first control unit adapted to perform image processing. The program includes code for supplying power for backing up image data stored in a storage unit from a first power supply unit on a second control unit adapted to expand a processing function of the first control unit.

According to the present invention, it is unnecessary to provide a first control board with a power supply unit beforehand for backing up data stored in an image memory, and the cost of the image processing apparatus as a whole can be reduced. When a second control board is connected, data stored in the image memory can be automatically backed up by a power supply unit. Thus, a data backup function is performed when the second control board is connected so that the data can be prevented from being lost. Accordingly, a function expansion can be freely performed with such excellent convenience.

Further, when effective data is stored in a plurality of image memory blocks, the effective data is transferred to another image memory block or blocks, and is relocated in order. Alternatively, image data is transferred and relocated into the image memory block or blocks according to a predetermined writing order. Backup power is not supplied to the image memory block or blocks not storing effective data, but is supplied only to the image memory block or blocks storing effective data. Therefore, as compared with a configuration in which a plurality of image memory blocks are backed up unconditionally, electric current consumption for backup can be reduced. Accordingly, a life of a storage battery can be made longer.

Further features of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate numerous embodiments, features and aspects of the present invention and, together with the description, serve to explain the principles of the invention.

DETAILED DESCRIPTION OF THE EMBODIMENTS

Numerous exemplary embodiments, features and aspects of the present invention will now herein be described in detail with reference to the drawings. It should be noted that the relative arrangement of the components, the numerical expressions and numerical values set forth in these embodiments are not intended to limit the scope of the present invention unless it is specifically stated otherwise.

First Exemplary Embodiment

Figure 1:
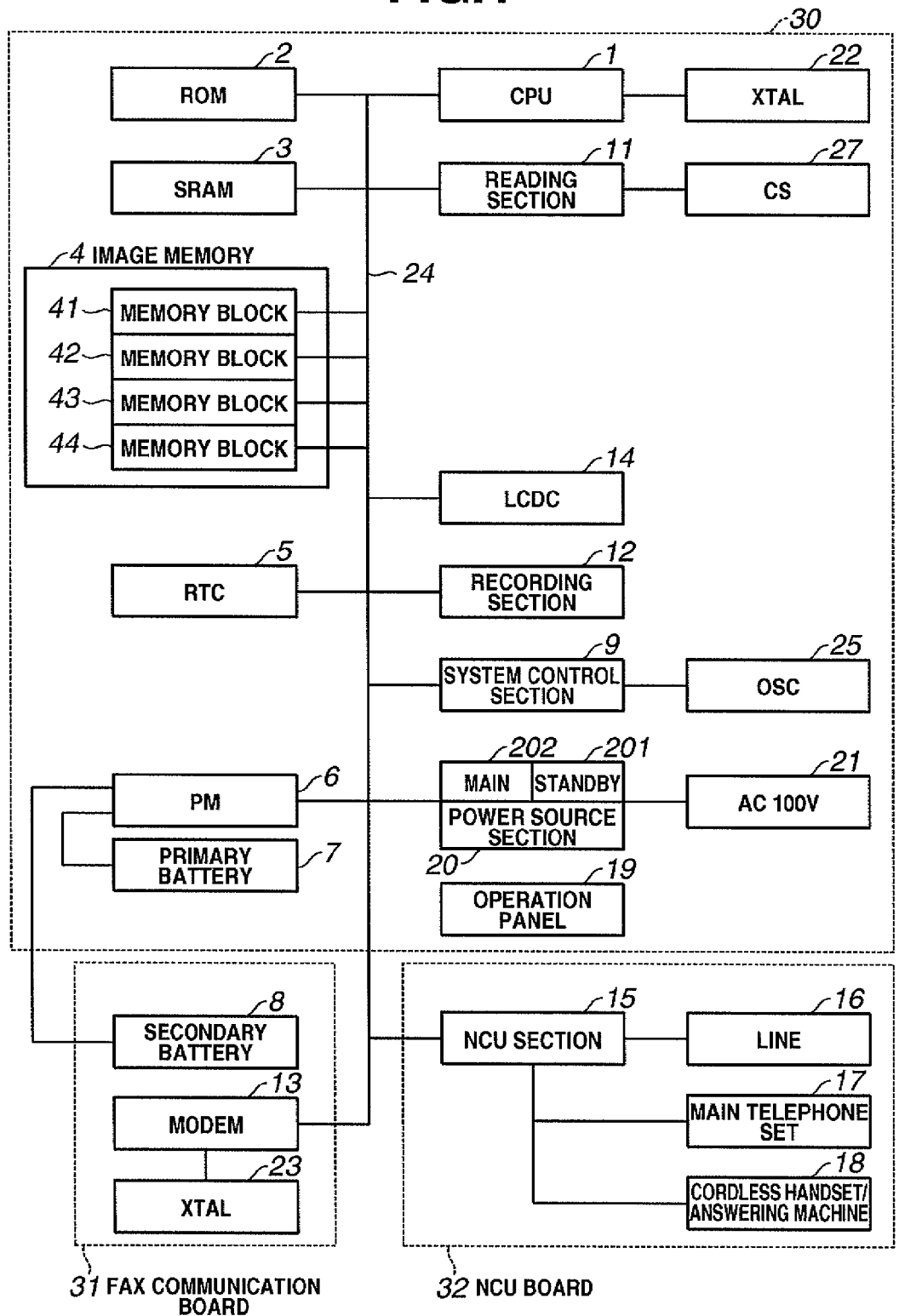
FIG. 1 is a block diagram showing an exemplary configuration of an image processing apparatus according to an embodiment of the present invention.

FIG. 1 is a block diagram showing an exemplary configuration of an image processing apparatus according to a first embodiment of the present invention. The configuration shown in FIG. 1 corresponds to an example of a communication apparatus including, for example, a system control board 30 connected with boards for performing predetermined function processings, for example, a facsimile communication board 31 and a network control unit (NCU) board 32. The present embodiment illustrates an example of a multi-function image processing (MFP) apparatus serving as an image processing apparatus connected with an optional board for function expansion. The multi-function image processing apparatus is hereinafter simply referred to as the image processing apparatus.

In the system control board 30 shown in FIG. 1, a CPU 1 controls the image processing apparatus including each device connected to a bus 24, according to a control program stored in a ROM 2.

An SRAM 3 and an image memory 4 are backed up by batteries, and are configured to store data which should be retained even when power fails or a power source section 20 is shut off. The image memory 4 is composed, for example, of volatile memory media, such as DRAMs, and includes a plurality of memory blocks, such as an image memory block 41, an image memory block 42, an image memory block 43, and an image memory block 44 (storage memory blocks). Image data for facsimile transmission or copying output from a reading section 11 is stored in the image memory 4. In addition, image data for facsimile reception, copying or printing to output to a recording section 12 is stored in the image memory 4 likewise.

The SRAM 3 is used to store abbreviated dialing and one-touch dial data which are used to specify a destination to which image data is to be transmitted, and also to store conditions of a software switch. The image memory 4 is used mainly to store image data. A crystal oscillator (XTAL) 22 supplies a system clock to the CPU 1.

A PM 6 is a power management circuit, which includes a control circuit for conducting system reset, watchdog timer, backup control for the image memory 4 and the SRAM 3, etc., and also includes a charge and discharge circuit for charging and discharging a primary battery 7 and a secondary battery 8.

A system control section 9 is a system control IC, which includes a general-purpose port, a DRAM controller, a bus master real-time port, an interface for SLAVE-UPI, and so forth. The system control section 9 further includes a CI detection timer, a panel interface, a general-purpose timer, a clock generator 25, an ESS control circuit, a CODEC, and so forth. The CODEC codes transmission data and codes reception data. A reading section 11 reads a document image with an imaging device (CS) 27 when a facsimile is transmitted, an image is copied, or an image is scanned.

An LCD controller 14 includes an LCD control circuit for controlling an LCD unit of an operation panel 19, a general-purpose I/O, and so forth. The primary battery 7 is used as a power source for backing up the SRAM 3. The secondary battery 8 is used as a power source for backing up the image memory 4. A rechargeable element is used as the secondary battery 8. An real-time clock (RTC) 5 is used in displaying time on a communication, and is backed up by the primary battery 7. Besides, the PM 6 is backed up by the primary battery 7.

A recording section 12 prints out an image when a facsimile is received or an image is copied or printed, and is constituted by a recording mechanism adopting a method, such as an electrophotographic method and an inkjet method. A modem section 13 operates according to a timing signal produced by an oscillator circuit 23 to modulate transmission data and demodulate reception data.

The power source section 20 supplies a direct current power to the digital MFP apparatus. Specifically, when a power switch is turned on to supply an AC (i.e. 100V according to the present embodiment) 21 to the power source section 20, the power source section 20 outputs a plurality of direct current voltages (for example, 24 V, 12 V, 18 V, 5.0 V, and 3.3 V).

The power source section 20 includes a standby power source 201 and a main power source 202. Each of the standby power source 201 and the main power source 202 is composed of a switching power circuit (see also FIG. 4). The voltage output by the main power source 202 is controlled on/off by controlling a remote signal by the CPU 1 via remote control.

The main power source 202 is constituted by a supply circuit for supplying 3.3 V for driving the recording section 12, 24 V for driving a motor and a plunger, 12 V for driving an analog circuit of a communication system, and 18 V for hook detection of a telephone set. On the other hand, the standby power source 201 is constituted by 5V or 3.3V for driving the system control section of the communication apparatus.

The NCU board 32 includes an NCU section 15, a telephone line 16, a main telephone set 17, and a cordless handset/answering machine 18.

The facsimile communication board 31 is connected to the above system control board 30 to provide a facsimile communication function as an option. The facsimile communication board 31 includes the modem 13 and the secondary battery 8. When the facsimile communication board 31 is connected to the system control board 30, i.e., when the facsimile communication function is provided, the secondary battery 8 of the facsimile communication board 31 functions as a backup power source for backing up image data stored in the image memory 4. Accordingly, image data received and stored in the image memory 4 and image data stored for a time designated communication are prevented from being erased by an accident, such as a power failure.

Thus, the image processing apparatus includes the system control board 30 which functions as a first control board configured to perform predetermined image processing. When the facsimile communication board 31 which functions as a second control board is connected to the image processing apparatus, a memory backup function is enabled for the image memory 4 storing data to be processed by the system control board 30. When the facsimile communication board 31 is not required, image processing can be performed only using the system control board 30 including the image memory 4, since the secondary battery 8 is provided on the facsimile communication board 31.

Accordingly, a cost burden is reduced remarkably as compared with a case where the secondary battery 8 is provided beforehand on the system control board 30. On the other hand, when the facsimile communication board 31 is required, i.e., when the facsimile communication board 31 transmits and receives data stored in the image memory 4, the secondary battery 8 surely enables the memory backup of the image memory 4. Accordingly, even when an accidental power trouble, such as a power failure, occurs while the facsimile communication board 31 is being used, the data stored in the image memory 4 can be surely prevented from being erased.

Thus, according to the present embodiment, a board connected originally for the purpose of function expansion is provided with peripheral resources, such as a member, a means, a control program, and a power source, which are required in order to perform an additional function processing. Functions of such resources are used in conjunction with members, such as a memory unit, which are provided on a control board and may serve as fundamental resources, to perform the additional function processing.

Hence, with such simple configuration on the control board serving as a fundamental board, the image processing apparatus can be freely designed while satisfying both requirements, i.e., cost reduction of the whole apparatus and sure execution of an expanded function, at the same time. According to the present embodiment, the secondary battery 8 is used in the backup function processing for the image memory 4. However, the present invention is applicable not only to the image processing apparatus, but also to various electronic apparatuses.

Figure 2:
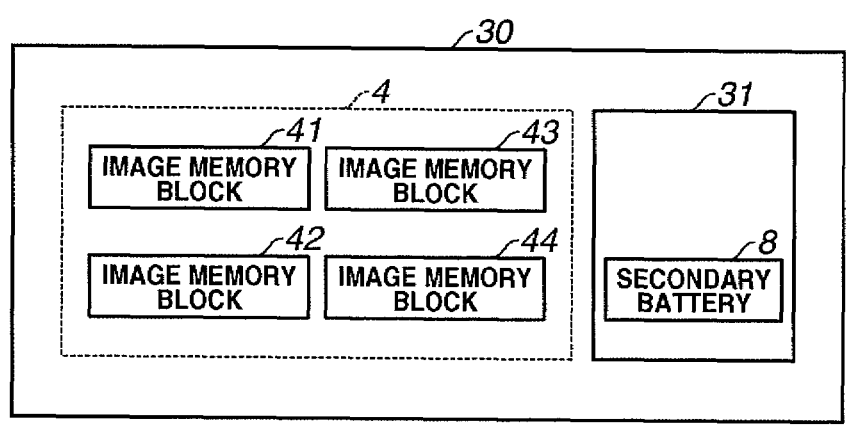
FIG. 2 is a block diagram illustrating a relation between an image memory of a system control board and a facsimile communication board according to the embodiment of the present invention.

FIG. 2 is a block diagram illustrating a relation between the image memory 4 of the system control board 30 and the facsimile communication board 31 shown in FIG. 1. Elements in FIG. 2 that are similar to the elements shown in FIG. 1 are indicated by the same reference numerals. In the present embodiment, the image memory 4 includes a plurality of image memory blocks 41 to 44, as shown in FIG. 2. Each of the image memory blocks 41 to 44 is used to constitute the large-capacity image memory 4.

When the facsimile communication board 31 is connected, if the voltage supplied from the main power source 202 to the image memory 4 decreases so that the image memory 4 is coming to a stop, effective data required to be backed up is read from each of the image memory blocks 41 to 44 of the image memory 4. Then, the image data is densely written in one of the image memory blocks 41 to 44. After that, only the image memory block storing the image data densely is backed up by backup power from the secondary battery 8 so that the image data is not lost. Further, in order to restrict backup power supply to the other image memory blocks not storing the image data, discharge of the secondary battery 8 is controlled by the PM 6 according to a procedure of a flowchart shown in FIG. 3 as described hereinafter.

Thus, by writing densely in one of the blocks, data distributed to each image memory block can be densely aggregated to reduce memory blocks to be used as much as possible. Accordingly, the secondary battery 8 can be used to back up the image memory 4 for a longer time.

Figure 3:
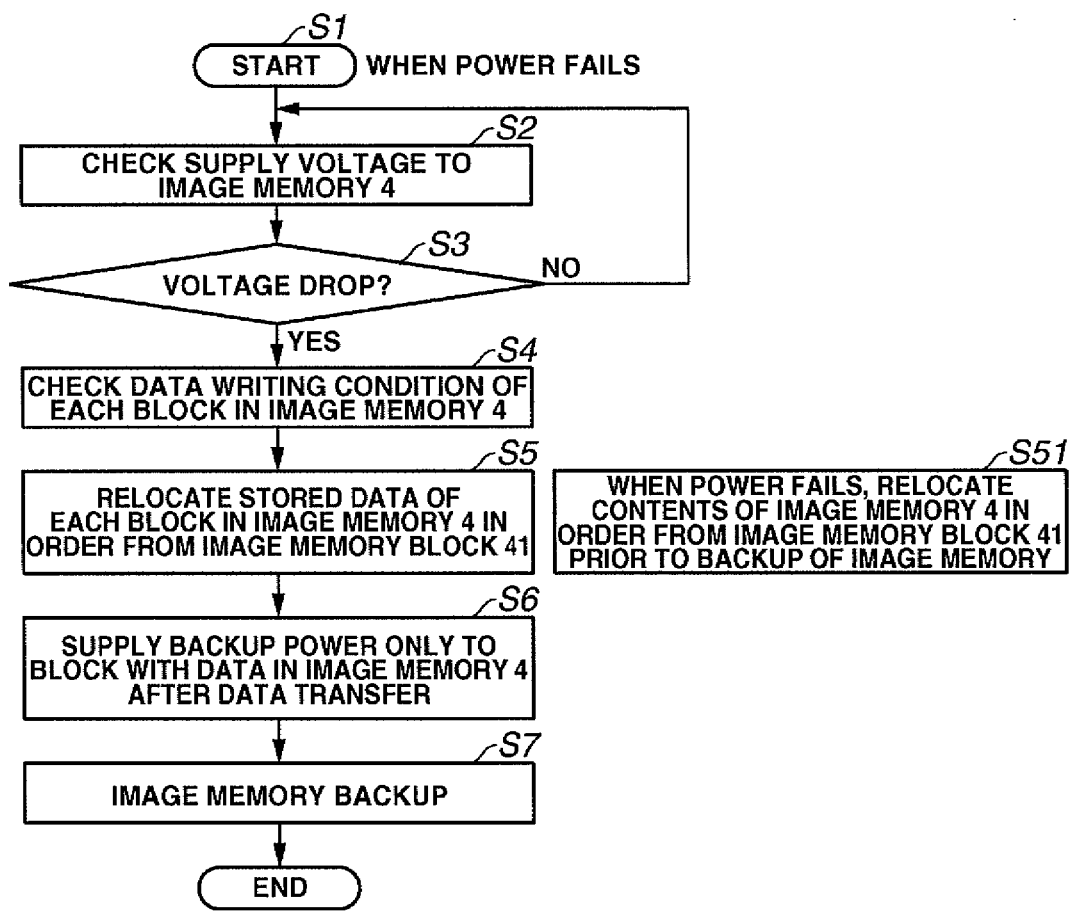
FIG. 3 is a flowchart showing an example of a memory backup controlling method adopted in the image processing apparatus according to the embodiment of the present invention.

FIG. 3 is a flowchart showing an example of a memory backup controlling method adopted in the image processing apparatus according to the present invention, and corresponds to the procedure of backup power supply by the secondary battery 8 that is controlled by the PM 6 shown in FIG. 1. S1 to S7 indicate respective steps, each of which may be achieved by the CPU 1 loading and executing the control program stored in the ROM 2 on a system memory.

First, in step S1, the presence or absence of an optional board is determined by the CPU 1 detecting a pin of the facsimile communication board 31, for example, when the facsimile communication board 31 serving as the optional board is attached to the system control board 30.

Figure 4:
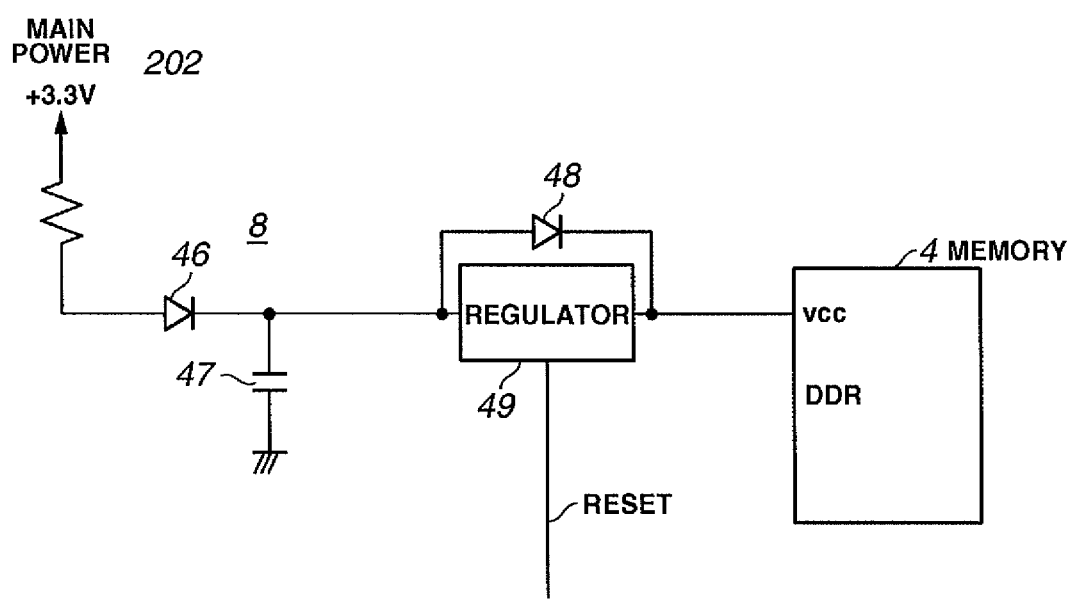
FIG. 4 is a diagram showing an example of a backup power supply circuit for supplying backup power to a secondary battery and the image memory according to the embodiment of the present invention.

Next, in step S2, the PM 6 checks a supply voltage (e.g. 3.3 V as shown in FIG. 4) supplied from the power source section 20 to the image memory 4, and determines whether the supply voltage decreases below a predetermined reference voltage (step S3). When the PM 6 determines that the supply voltage has not decreased below the predetermined reference voltage, the procedure returns to step S2, and the PM 6 monitors decrease in the supply voltage to the image memory 4.

On the other hand, when the PM 6 determines in step S3 that the voltage has decreased below the predetermined reference voltage, the CPU 1 checks a writing condition of data in each of the memory blocks 41, 42, 43, and 44 of the image memory 4 in step S4 to check a writing position and the amount of data. Operation of step S4 may also be controlled so that the CPU 1 can check the writing condition of data in a short time when power fails by grasping the writing condition of the data in advance before the power fails.

Next, in step S5, image data is rewritten according to a result of the checking of the writing condition of the image data in each of the blocks 41-44. Accordingly, data is rewritten by relocating the data in order from the image memory block 41 of the image memory 4.

Next, in step S6, after the image data is rewritten, the backup power is controlled by the PM 6 to be supplied only to the memory block or blocks in which the image data is written. On the other hand, the backup power is controlled by the PM 6 not to be supplied to the image memory block or blocks in which the image data is not written. Accordingly, electric current consumption of the image memory 4 decreases. In this case, the image memory 4 can be backed up for an even longer time using the secondary battery 8 than when all of the image memory blocks are backed up using the secondary battery 8.

Then, in step S7, the image memory backup is continued. When the main power starts to be supplied from the power source section 20, the PM 6 ends the control of the backup power from the secondary battery 8.

Thus, the backup power of the secondary battery 8 is supplied to the image memory block or blocks storing the image data relocated in step S5. The backup power is not supplied from the secondary battery 8 to the image memory block or blocks not storing any image data at all. Accordingly, image data can be backed up using the secondary battery 8 for a longer time. Therefore, even when a power trouble, such as a power failure, occurs, a reproducible time of the image data stored before a power recovery can be made longer correspondingly.

FIG. 4 is a diagram showing an example of a backup power supply circuit for supplying the backup power to the secondary battery 8 and the image memory 4 shown in FIG. 1. Elements in FIG. 4 that are similar to the elements shown in FIG. 1 are indicated by the same reference numerals. In FIG. 4, for example, +3.3 V of the main power source 202 is applied to a diode 46, and the diode 46 charges a capacitor 47. A reset signal is applied to a regulator 49. When power fails, the reset signal becomes "L" so that an output of the capacitor 47 is applied to the image memory 4. Normally, the reset signal is "H" so that the above +3.3 V is controlled to be applied from the main power source 202 through to the image memory 4. A diode 48 is connected to the regulator 49.

The capacitor 47 is a capacitor, such as a "super capacitor", which is provided with high power density and high energy density performance characteristics. In general, this capacitor uses both a charge storage (physical adsorption and desorption of ions to an electrode) by an electric double layer formed at an interface of the electrode and an electrolyte and a pseudo-capacity (electrochemical adsorption and desorption of ions to the electrode) using an oxidation-reduction reaction on a surface of the electrode.

Still further, according to the above first embodiment, the secondary battery for backing up the image memory is mounted on the optional board having the optional function. Therefore, it becomes possible to supply the backup power for backing up the image memory by attaching the above optional board. And thus, unlike a conventional configuration, the image memory is not backed up regardless of the presence or absence of the optional function, but can be backed up according to the function.

The circuit configuration described above is commonly applicable to an image processing apparatus, such as a facsimile machine or a similar digital multi-function machine, and the present invention can be applied not only to a configuration similar to such a facsimile machine but to communication apparatuses in other forms. For example, the present invention can be applied to communication apparatuses based on an E-mail function.

In another example, the present invention can also be applied to a configuration in which a general-purpose terminal such as a personal computer is provided with an external/internal facsimile modem etc., and is configured to perform a facsimile communication by software control.

Second Exemplary Embodiment

According to the first embodiment, when a voltage drop is detected in step S3 shown in FIG. 3, image data distributed to each image memory block is written so as to be relocated in order into a target memory block. The target memory block is a head memory block in this description. However, even when a voltage drop is detected, the whole memory block may also be simply backed up using the secondary battery 8 without relocating the image data so as to shift to a memory backup condition in a short time. In this case, the memory backup is adaptable to an instantaneous interruption of the power source section 20.

Alternatively, when a voltage drop is detected, only the block or blocks storing effective image data among the image memory blocks may be backed up individually. Further, when a voltage drop is detected, if effective image data is separately distributed to a number of blocks, the effective image data may also be gathered and restored not only in the head block, but in a specific memory block predetermined among the memory blocks.

Besides, when a voltage drop is detected, image data distributed to image memory blocks may also be written beforehand in order in a specific memory block by background processing. In this case, step S51 shown in FIG. 3 is performed at a timing preceding step S1 so that step S5 shown in FIG. 3 can be skipped, and step S6 can be performed promptly.

Further, when a voltage drop is detected, whether to perform the backup control shown in FIG. 3 may be determined according to a condition of a mode setting provided for determining whether to perform the backup control. In this case, wasteful discharge from the charged secondary battery 8 can be restricted, and a life of the secondary battery 8 can be sustained for a long duration.

This process may also be combined with a control method which enables or disables the above mode setting when data is received from a specific source or origin. Besides, the above process may also be combined with a control method which enables or disables the above mode setting according to a connection condition of an optional board as mentioned above.

Other Exemplary Embodiments, Features and Aspects of the Present Invention

Figure 5:
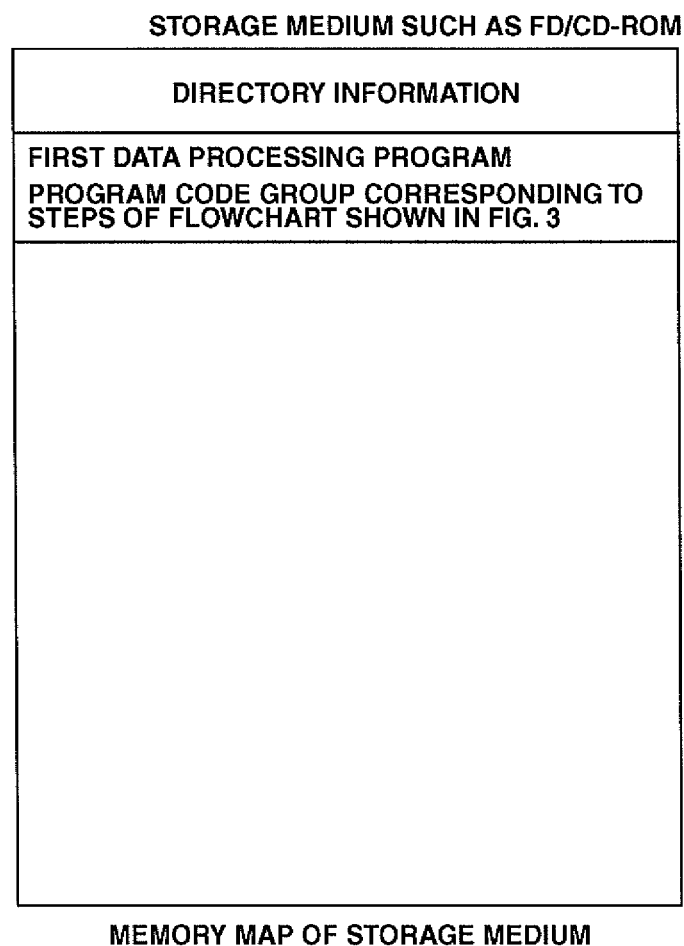
FIG. 5 is a diagram illustrating an exemplary memory map of a storage medium storing various data processing programs readable by the image processing apparatus according to the embodiment of the present invention.

Hereinafter, an exemplary structure of data processing programs readable by the image processing apparatus according to the present invention is described with reference to a memory map shown in FIG. 5. Although not particularly shown in FIG. 5, the storage medium may also store information, e.g., version information, a creator, etc., for managing a program group stored in the storage medium, and may also store information, e.g., an icon to identify each program, which depends on an OS, etc., that reads the programs.

Besides, data subject to the various programs is also managed in the above directory. Further, the storage medium may also store a program for installing the various programs in a computer, a program for uncompressing the installing program when the installing program is compressed, and so forth.

The function shown in FIG. 3 in the present embodiment may also be performed by a host computer according to an externally installed program. In this case, the present invention is also applicable when an information group including the program is supplied to an output unit by means of a storage medium, such as a CD-ROM, a flash memory or an FD, or from an external storage medium via a network.

A storage medium on which program code of software for achieving the functions according to the above embodiments is recorded may also be supplied to a system or apparatus. The aspect of the present invention is achieved by a computer (or a CPU or MPU) of the system or the apparatus reading and executing the program code stored in the storage medium.

In this case, the program code per se which is read from the storage medium achieves new functions according to the present invention, and the storage medium storing the program code constitutes the present invention. Therefore, the program may have any form, such as an object code, a program executed by an interpreter, or a script data to be supplied to an OS, as long as it has a function of a program.

As the storage medium for supplying the program, a flexible disk, a hard disk, an optical disk, a magnet-optical disk, a magneto-optical disk (MO), a CD-ROM, a CD-R, a CD-RW, a magnetic tape, a nonvolatile memory card, a ROM, a DVD, etc., can be used, for example. In this case, the program code per se which is read from the storage medium achieves the functions according to the above embodiments, and the storage medium storing the program code constitutes the present invention.

According to other methods for supplying the program, the program may also be downloaded from a homepage on the Internet, using a browser of a client computer. A computer program per se according to the present invention or a file which is compressed and includes an auto-install function may also be downloaded from a homepage to a recording medium, such as a hard disk. Alternatively, a program code that constitutes the program according to the present invention may be divided into multiple files, and each of the files may be downloaded from different homepages. Accordingly, a World Wide Web (WWW) server, a ftp server, etc., for a plurality of users to download a program file for achieving the function processings according to the present invention in a computer are included in claims of the present invention.

Besides, the program according to the present invention may also be encrypted, be stored in a storage media such as a CD-ROM, and be distributed to a user. In this case, only a user who satisfies a predetermined condition may be allowed to download decryption key information from a homepage via the Internet, and the encrypted program may be executed using the key information and be installed in a computer.

Besides, the functions according to the above embodiments may also be achieved by executing program code read by a computer. According to directions of the program code, an OS (operating system) running on the computer performs a part or all of an actual process, and the functions according to the above embodiments can be achieved by the process.

Further, the program code read from a storage medium may be written in a memory provided in a function expansion board inserted in a computer or a function expansion unit connected to a computer. According to the directions of the program code, a CPU, etc., provided in the function expansion board or the function expansion unit may also perform a part or all of the actual process. The functions according to the above embodiments can also be achieved by this process.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

What is claimed is:

1. An image processing apparatus comprising:
a memory adapted to store image data;
a printing unit adapted to print an image based on the image data stored in the memory;
a first power supply unit adapted to supply power to the memory;
a detecting unit adapted to detect that a fax communication board is connected to the image processing apparatus, the fax communication board comprising a second power supply unit which includes a capacitor to be charged by power supplied from the image processing apparatus; and
a switching unit adapted to switch a first state in which the first power supply unit supplies power to the memory to a second state in which the second power supply unit in a fax communication board of which the connection to the image processing apparatus is detected supplies power to the memory, in a case where the first power supply unit does not supply power to the memory.

2. The image processing apparatus according to claim 1, wherein the capacitor included in the second power supply unit is charged by power supplied from the first power supply unit.

3. The image processing apparatus according to claim 1, further comprising a control unit adapted to control the fax communication board to store image data received via the fax communication board into the memory, in a case where the detecting unit detects that the fax communication board is connected to the image processing apparatus.

4. The image processing apparatus according to claim 3, further comprising a scanning unit adapted to scan an original document and to input image data corresponding to the original document,
wherein the image data input by the scanning unit is stored in the memory.

5. The image processing apparatus according to claim 4, wherein the control unit performs control such that the image data input by the scanning unit is transmitted via the fax communication board, in a case where the detecting unit detects that the fax communication board is connected to the image processing apparatus.

6. The image processing apparatus according to claim 1, wherein the memory includes a plurality of memory blocks for storing image data.

7. The image processing apparatus according to claim 6, wherein the switching unit switches the first state to a state in which power is supplied from the second power supply unit to a memory block storing image data among the plurality of memory blocks and the power is not supplied to a memory block not storing image data among the plurality of memory blocks, in a case where the power supplied from the first power supply unit to the memory has decreased below a predetermined reference voltage.

8. The image processing apparatus according to claim 1, wherein the switching unit switches the first state to the second state in a case where the detecting unit detects that the fax communication board is connected to the image processing apparatus.

9. A backup processing method in an image processing apparatus which includes a memory adapted to store image data and a first power supply unit adapted to supply power to the memory, the method comprising:

printing an image based on the image data stored in the memory;

detecting that a fax communication board is connected to the image processing apparatus, the fax communication board comprising a second power supply unit which includes a capacitor to be charged by power supplied from the image processing apparatus; and switching a first state in which the first power supply unit supplies power to the memory into a second state in which the second power supply unit in a fax communication board of which the connection to the image processing apparatus is detected supplies power to the memory, in a case where the first power supply unit does not supply power to the memory.

* * * * *